United States Patent
Clark, III

(10) Patent No.: US 6,323,910 B1
(45) Date of Patent: Nov. 27, 2001

(54) METHOD AND APPARATUS FOR PRODUCING HIGH-FIDELITY IMAGES BY SYNCHRONOUS PHASE COHERENT DIGITAL IMAGE ACQUISITION

(76) Inventor: William T. Clark, III, 13 Park La., Folsom, LA (US) 70437

( * ) Notice: Subject to any disclaimer, the term of this patent is extended or adjusted under 35 U.S.C. 154(b) by 0 days.

(21) Appl. No.: 09/048,323

(22) Filed: Mar. 26, 1998

(51) Int. Cl.$^7$ ........................................................ H03L 7/00
(52) U.S. Cl. ........................... 348/537; 348/572; 331/20; 327/142; 327/299
(58) Field of Search ............................. 348/536, 537, 348/512, 539, 540, 541, 542, 543, 544, 545, 546, 513, 514, 572; 331/1 A, 2, 11, 12, 14, 17, 18, 25, 20; 327/142, 143, 156–159, 218, 299, 147–150, 198, 291; H03L 7/00

(56) References Cited

U.S. PATENT DOCUMENTS

| | | | |
|---|---|---|---|
| 3,872,497 | * 3/1975 | Amery et al. | ........................... 348/665 |
| 4,562,411 | * 12/1985 | O'Rourke et al. | ..................... 331/1 A |
| 4,777,620 | 10/1988 | Shimoni . | |
| 4,831,444 | * 5/1989 | Kato | ...................................... 348/518 |
| 5,117,290 | * 5/1992 | Heerkens | ............................... 348/536 |
| 5,298,999 | * 3/1994 | Nagano | .................................. 348/536 |
| 5,311,602 | 5/1994 | Nieglos . | |
| 5,359,366 | * 10/1994 | Ubukata et al. | ....................... 348/536 |
| 5,400,371 | 3/1995 | Natarajan . | |
| 5,420,895 | 5/1995 | Kim . | |
| 5,450,136 | 9/1995 | Cirineo . | |
| 5,528,307 | 6/1996 | Owada . | |
| 5,533,138 | 7/1996 | Kim . | |
| 5,537,492 | 7/1996 | Nakajima . | |
| 5,673,209 | 9/1997 | Heiney . | |
| 5,886,582 | * 3/1999 | Stansell | ................................. 331/1 A |

* cited by examiner

Primary Examiner—Michael Lee
(74) Attorney, Agent, or Firm—Pillsbury Winthrop LLP

(57) ABSTRACT

An apparatus and method for synchronizing sampling of a video signal to a video synchronization signal of the video signal are provided. The frequency-divided output of an oscillator (or other controllable frequency source) is applied as one input to a phase detector, while the other input to the phase detector is supplied by the video synchronizing signals. The error signal voltage output of the phase detector is applied to correct the frequency, and thereby the phase, of the oscillator output through a dynamically-tuned phase-locked loop filter until the phases of the two input signals are in perfect agreement and no error voltage is produced. After a delay for this phase correction, during which time all video amplification is suspended, an output of the oscillator is then applied to sample the image without the presence of phase disparities while video amplification is restored. Full dynamic range digital acquisition then proceeds with extremely high accuracy at any desired resolution. An apparatus and method are provided for achieving such operation.

52 Claims, 12 Drawing Sheets

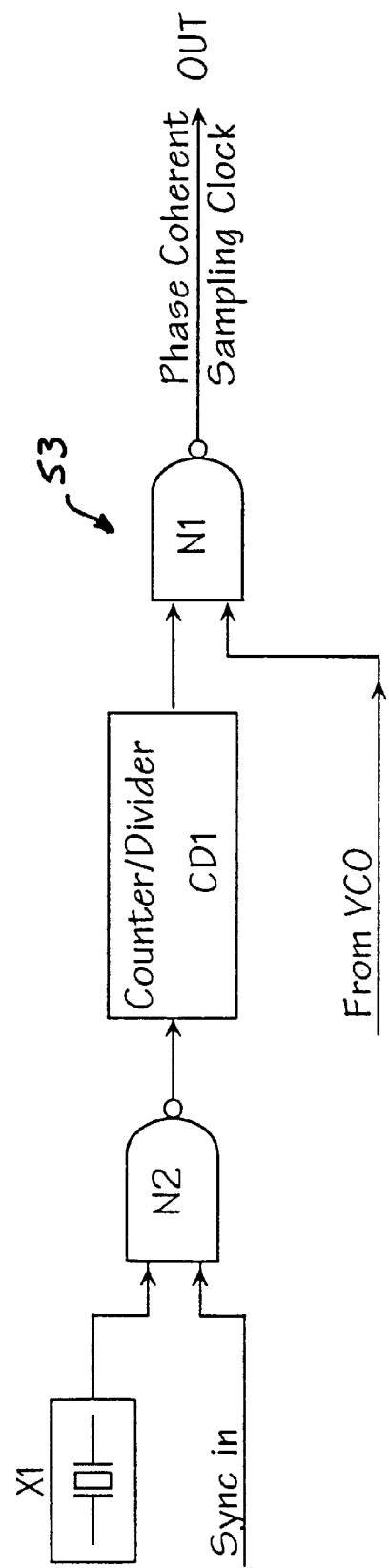

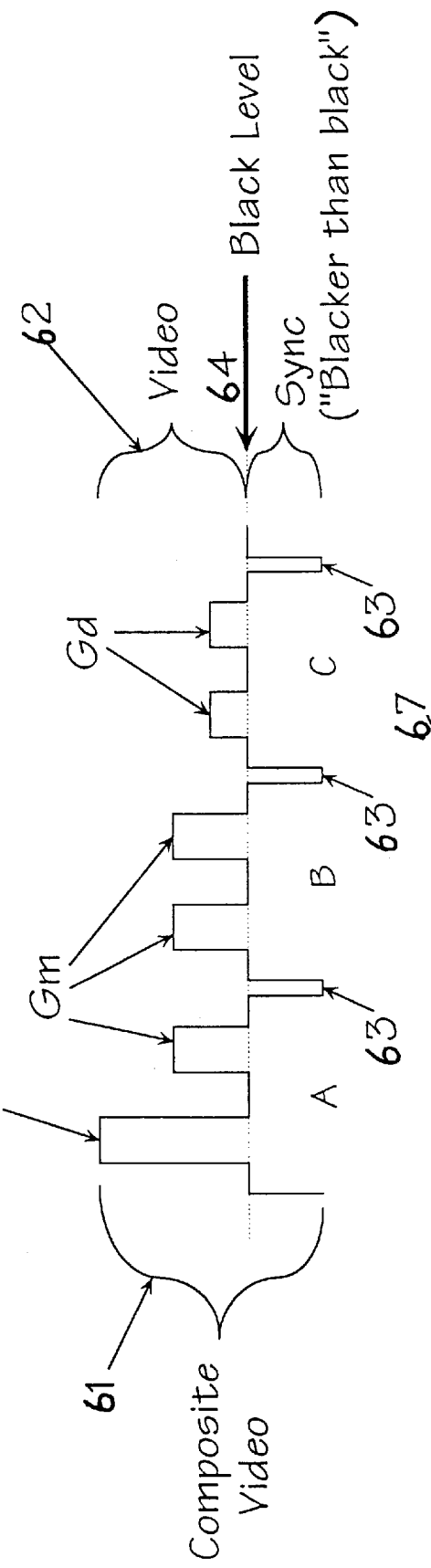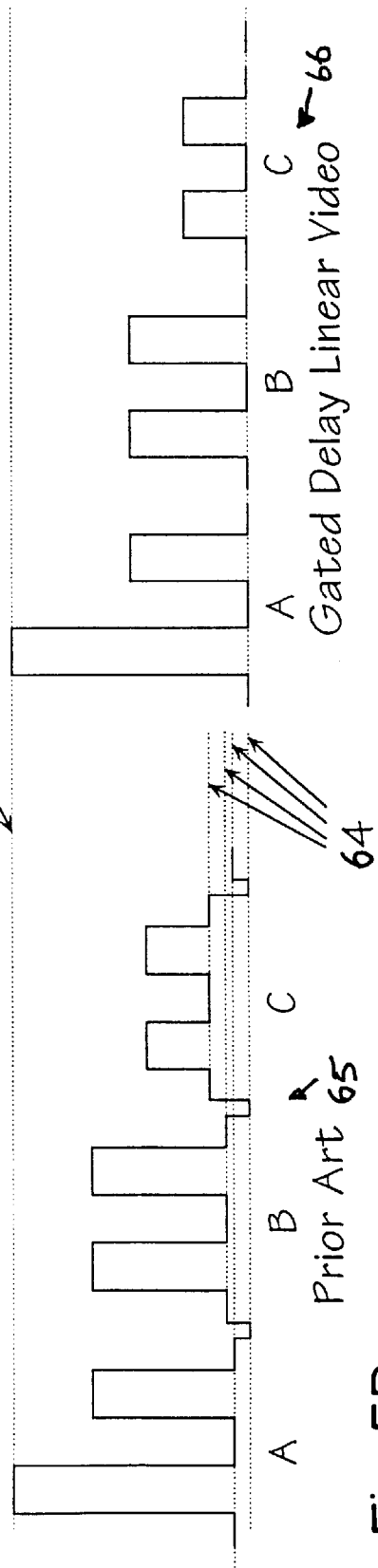
Fig. 5A
Fig. 5B
Fig. 5C

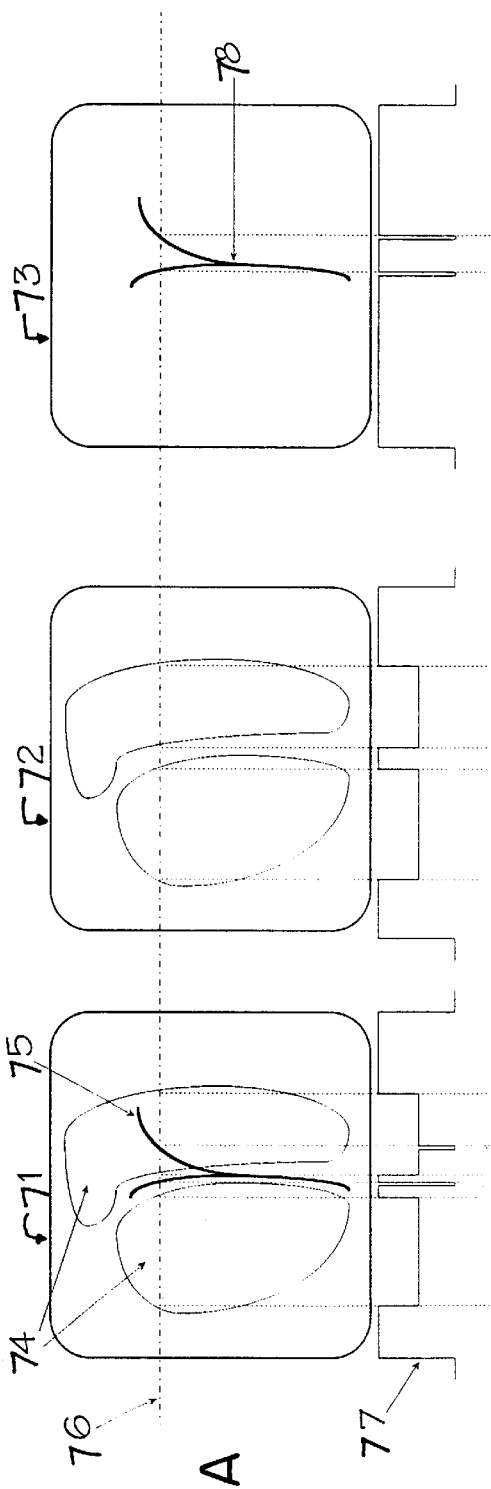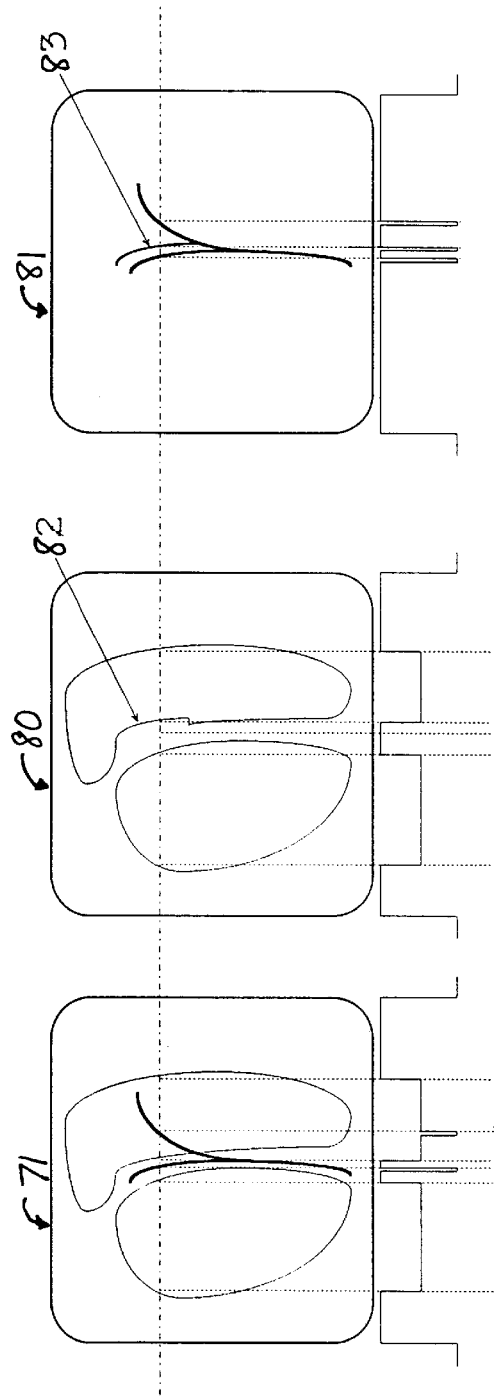
Fig. 6A
Fig. 6B (PRIOR ART)

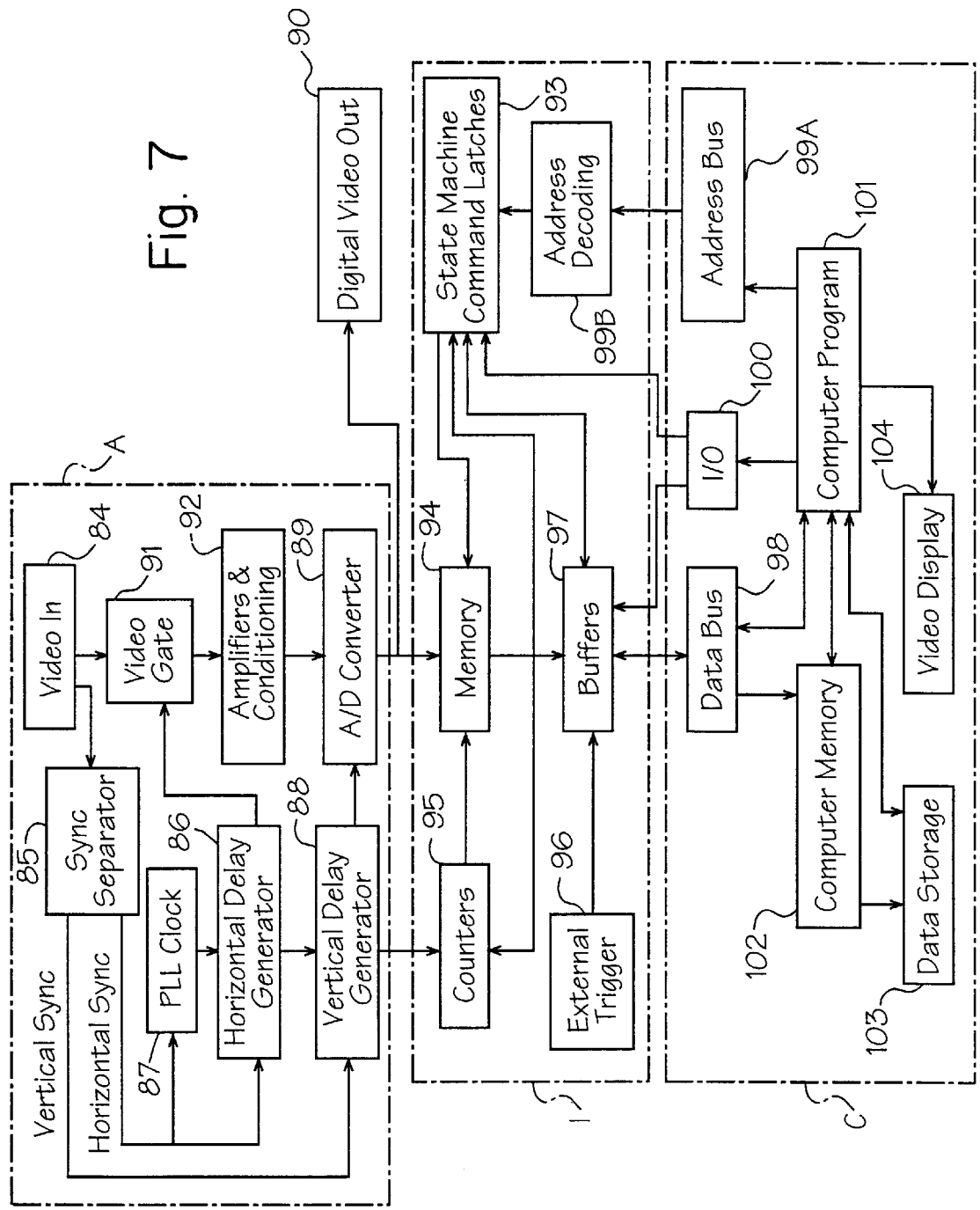

METHOD AND APPARATUS FOR PRODUCING HIGH-FIDELITY IMAGES BY SYNCHRONOUS PHASE COHERENT DIGITAL IMAGE ACQUISITION

FIELD OF THE INVENTION

The invention relates to the production of high-fidelity digital images from analog video signals.

BACKGROUND OF THE INVENTION

Rapid advancements in imaging technologies have led to the need for digital images of ever-higher precision acquired at high speed. This need is particularly acute for technical applications, such as computed tomography and radiology, magnetic resonance imaging, teleradiology, digital cinematography and the like, where analog images are rapidly scanned by or converted into some form of television signal or image before digital conversion and storage.

The conventional process for conversion of analog television images into digital images is straightforward. Each scan line of the television image is periodically sampled or "clocked" at a rate sufficient to produce the desired resolution. Each sample is converted to a unique binary code representing the pixel value for that sample (the samples are said to be "quantized") through an analog-to-digital (AD) converter, and the samples are then stored or displayed in a format representative of the original analog image. If the images are sampled at a sufficiently high rate and the quantizing is sufficiently accurate while the images are displayed in rapid succession or updated frequently, then this conventional process appears adequate for ordinary viewing by the forgiving human eye. However, if high-precision, high-fidelity images are to be scrutinized for technical application such as computed tomography and radiology or color imaging, then the conventional process has been plagued with hitherto inadequately resolved difficulties.

Precision digital conversion of analog images requires not only that the analog values be accurately converted but also that each sample of each line should occur at exactly the same points as along the previous line, otherwise the spatial and tonal representation of the image will be corrupted. This means that the sampling clock must be extremely stable and sample on the same phase as the previous line and at exactly the same time relative to the start of the line (each line in a television image "starts" with a synchronizing pulse). The necessity for these timing requirements is illustrated in FIGS. 1A–1E, where an analog television image 4 is shown scanning the image of two bars, one white (W), and the other gray (G). Three lines 1, 2, 3 are shown in the composite image waveform 5, producing the analog image at 8. The vertical synchronizing pulse is shown at 6, while the horizontal pulses are shown at 7. A conventional prior-art digital sampling clock is shown at 9, which converts the composite waveform 5 into the digital image 10. This sampling clock 9 has a constant frequency and therefore suffers a phase sampling error 12 because samples may be taken early or late relative to the previous or successive line. If the samples are taken on the falling edge of the clock cycles, for example, then it is easily seen that the sample at 11 is correctly taken on the falling edge of the clock 9. However, then the sample 12 is erroneously taken late, since the clock 9 is rising at the same point in line 2 of the composite image waveform 5 as it falls in line 1. By the third line 3 the clock has returned into correct relative phase 13 and the sample is taken at the correct time. The result of the phase disparities in the clock 9 produce the corrupted image 10, where the second line is shown spatially displaced from its correct position. This problem is present in all conventional sampled television systems.

The usual solution for this problem is to produce images using very high-frequency sampling and then to average the results, with the hope that the errors will go unnoticed. It will be seen that as the sampling rate is increased, the visible increment of the error will be decreased—but it is always present in conventional systems. This produces visually "adequate" images suitable for ordinary viewing because the images are constantly moving and updated rapidly. However, such images cannot be considered accurate images or used for highly demanding applications, such as computed image reconstruction, or machine vision and the like, particularly where the images are to be used for some precise comparative purpose. This is because the phase disparities introduce inappropriate values or "phase noise" into the image. If the samples are averaged, then the grayscale values and spatial relationships lose precision; if the samples are not averaged, then they are potentially in wrong spatial locations producing inappropriate tonal values. In either event phase noise is a very pervasive image detriment.

Even aside from the burdens of high-frequency design, these excessively high sampling rates produce a torrent of other problems: great amounts of largely redundant data must be handled by the computer and then the data must be reconfigured into a proper image format. All of this takes time and greatly slows down the imaging process.

To conserve computer resources, these large, "oversampled" images are often greatly compressed, and high compression ratios mean that small details are sacrificed, while slowing the process still further. When the images are then reconstituted and expanded, the fine details are lost, the very purpose of their creation having been compromised since the details are missing, and some artifacts have appeared. In this connection, it is interesting to note that images with phase noise always compress less successfully than images without phase noise. The reduction of noise in digital images for broadcast is extremely important because such digital images are encoded in an MPEG (Motion Picture Experts Group) format which encodes the images based upon the differences between images. Of course, it is therefore imperative to assure that the difference between images is predominantly related to scene content and not noise content or the image quality suffers greatly. Compressed images with phase noise are larger because the artifacts make the image more complex. In all events, the images are unsuitable for precise scrutiny, and it turns out that the oversampled "high resolution" conventional images are not actually higher resolution, but simply higher data, because the high sampling rate serves only to mask image errors. The high sampling rate produces enormous images with "empty" resolution which does not improve the quality of the image record. This renders conventional digital images unsuitable for many applications and is a primary reason that digital radiology, for example, has been disappointing to many physicians.

The necessity for phase coherence of the sampling clock is illustrated at 10 of FIG. 1D, where the sampling clock with a phase discrepancy on successive horizontal lines of the image has produced a corrupted image. Portions of the image (the second line of image 10) are shown with spatial corruption—shifted right or left—because samples of the original image were taken at different times relative to adjacent lines. Very high sampling rates will make the discrepancy less apparent, but even if the image lines are shifted to accommodate, the image can still never be accurate because inappropriate portions of the image were sampled, thereby also corrupting the tonal values in the image.

SUMMARY OF THE INVENTION

It is apparent, therefore, that it is highly desirable to reduce sampling rates and that sampling rates can be decreased while image fidelity can be improved by removing the phase disparities between the video synchronizing pulses and the digital sampling clock. Accurate digital imaging requires a phase coherent sampling clock.

Accordingly, it is an object of this invention to provide a method of acquiring high-fidelity digital images from analog video images by means of a uniquely stabilized sampling frequency synchronously phase-locked to the video synchronizing signals.

It is a further object of this invention to provide digital images with wide dynamic range, low noise content, and high spatial and tonal fidelity.

It is a still further object of this invention to provide a means to verify that synchronous, phase coherent images have been obtained as an aid to design, manufacture, and quality control, and to provide a means to monitor video system quality.

These and other objects of the invention, including conservation of computer resources, will become apparent as the invention is more fully explained.

The frequency-divided output of an oscillator (or other controllable frequency source) is applied as one input to a phase detector, while the other input to the phase detector is supplied by the video synchronizing signals; the error signal voltage output of the phase detector is applied to correct the frequency, and thereby the phase, of the oscillator through a dynamically-tuned phase-locked loop filter until the phases of the two input signals are in perfect agreement and no error voltage is produced. After a delay for this phase correction, during which time all video amplification is suspended, an output of the oscillator is then applied to sample the image without the presence of phase disparities while video amplification is restored. Full dynamic range digital acquisition then proceeds with extremely high accuracy at any desired resolution.

The principle of the synchronous phase-corrected sampling clock of this invention is shown in FIG. 1B, where the frequency of the sampling clock 14 has been briefly raised at 15 and briefly lowered again at 16 with the result that the frequency and the phase of the sampling clock 14 always remains constant relative to the start of each video line 1, 2, 3 (FIG. 1A) during the sampling period of each video line. The brief changes in frequency 15, 16 are necessary to correct the phase of the sampling clock 14; of course, the phase can be shifted directly, but it will be recognized that this will still result in a momentary change in frequency during the time that the phase is changing. In either case equivalent results will be obtained, because the object is to correct the phase of the sampling clock 14.

It is important to understand that sampling of the image must begin only after phase correction or the image will be corrupted. It will be observed that the oscillator output is actually a multiple of the synchronizing frequency since the oscillator output is divided to equal the frequency of the synchronizing frequency before application to the phase detector. Such an arrangement is known as a "phase-locked loop" or "PLL". It should be appreciated that the opportunity for phase correction only occurs coincident with the synchronizing pulse or some portion of the synchronizing pulse, such as the rising or falling edge, or of some portions of pulses associated with the primary synchronizing pulses, such as colorburst, blanking, or equalizing pulses, but which may not all be present in all systems. The synchronizing pulses illustrated are typical industrial television pulses. If sampling begins before phase resolution, sampling "jitter" or phase noise will result and the image will lose fidelity because each sample will occur at the wrong time, therefore sampling the wrong part of the image, because the number of sample clock pulses per line will vary as the frequency of the clock is varied to bring it into phase. Each and every occasion of phase-detected comparison and correction is very rapid, but it is not instantaneous, and sampling of the image must not begin before the sampling and synchronizing phases are in perfect agreement.

The delay should be initiated by the synchronizing pulse; image sampling is initiated at termination of the delay.

The invention thus produces an intermittent train of synchronous, phase-coherent pulses which sample the image. These samples may then be used to produce an uncorrupted digital image.

During the delay all video amplification should be suspended not only to reduce electrical noise during phase resolution, but also to prevent amplification and digitization of the synchronizing pulses, since the synchronizing pulses are used only to control image acquisition and are not part of the video image. Restoration of video amplification after the delay presents only video without sync to the AD converter since the video amplification was cut off during the sync period.

All scanned video images begin as an electrical "analogue" of some values (such as the light values in an illuminated scene). When these values (the video data) are translated into their digital equivalents (whether in the camera, broadcast studio, or video receiver), they immediately become "digital images" or "digital video," although the images become viewable to the eye only when the digital values are ultimately converted into light values at the viewing device.

The terms "television" and "video," in the context of this invention are substantially interchangeable and are taken to mean any analog data used for imaging.

All scanning processes require synchronization in order to correctly assemble the scanned lines into a sensible image. Ordinary analog broadcast television, for example, uses a vertical synchronizing pulse to indicate where the top of the image frame (or field) begins. Horizontal synchronizing pulses indicate where each scan line in the image frame (or field) begins. (Of course, any pulse indicating the beginning of a field, frame, or line can also be understood to mean that the previous field, frame, or line has ended.)

After each vertical synchronizing pulse there begins a train of a precise number of precisely timed horizontal synchronizing pulses. Between each horizontal pulse lies the analog image data for that line corresponding to the electrical analogue values of the light values along the line in the illuminated scene which is to be depicted in the image.

There are many forms of television (video). Ordinary analog broadcast television, for example, may be referred to as "interlaced field-sequential television" by those skilled in the art because alternate vertical synchronizing pulses (indicated by associated "equalizing pulses") indicate alternate interlaced fields. Color television has still other pulses ("colorburst") associated with the horizontal synchronizing pulses. Still other analog video systems (used chiefly in medicine and industry) are so-called "frame sequential," because there are no interlaced fields.

But not all video is field or frame sequential. A rapid sequence of fields or frames is only required when it is desired to depict motion. Where only still images are desired, then a rapid sequence is not necessary, and the vertical synchronizing pulse may be eliminated or replaced with a single pulse, because the first horizontal pulse indicates the beginning of the image. In scanning electron microscopy, for example, the push of a button initiates a pulse which starts the train of horizontal pulses.

This invention is applicable to these forms of video (and others as well) because the invention is concerned with converting the analog video data into the highest fidelity digital data. This digital data may then be stored and later assembled into images, or the digital data may be immediately disseminated, transmitted, broadcast, or otherwise employed for instant viewing on a viewing device (after the digital data is reconverted into analog values for display on a cathode ray tube, for example).

The images produced by this invention are high fidelity because they enjoy spatial and temporal coherence and the widest possible dynamic range.

The image acquisition is synchronous because the digital sampling is synchronized to the synchronizing pulses, and the acquisition is phase coherent because the phase of the sampling clock is consistent, relative to the synchronizing pulses throughout the image.

The analog-to-digital converter and the ancillary amplifiers, signal conditioners, filters, controls and the like associated with the A/D converter are hereafter understood to mean the "quantizer" or "sampling unit." The sampling unit takes a sample (and therefore converts an analog value into a digital value) upon receipt of a pulse from a sampling clock.

BRIEF DESCRIPTION OF THE DRAWINGS

These and other objects and advantages of this invention will become apparent and more readily appreciated from the following description of the presently preferred but non-limiting exemplary embodiments, taken in conjunction with the accompanying drawings, of which:

FIGS. 4A–4C are schematic views of typical delay generator circuits for practicing the invention.

FIGS. 5A–5C are schematic views of three lines of video.

FIGS. 6A–6B are schematic views of video images from a medical fluoroscope, showing images obtained using the invention (FIG. 6A) compared with images of the prior art, (FIG. 6B) having errors.

FIG. 7 is a block diagram of a video system incorporating apparatus of the present invention.

DETAILED DESCRIPTION OF THE PREFERRED EMBODIMENTS

The examples of the invention discussed herein are non-limiting exemplary embodiments of the invention.

Figure 1A:
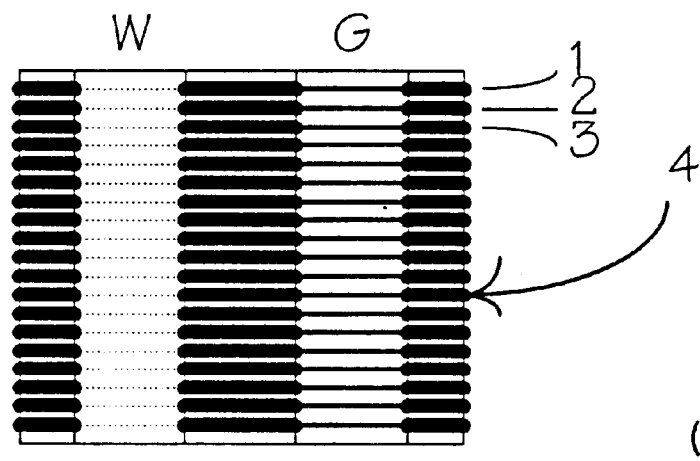
FIGS. 1A–1E are schematic views showing image sampling before and after phase correction.
Figure 1C:
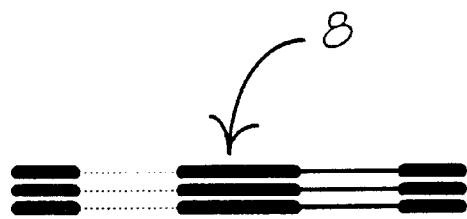
Figure 1D:
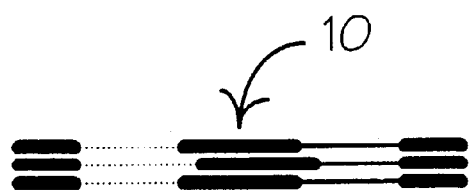
Figure 1E:
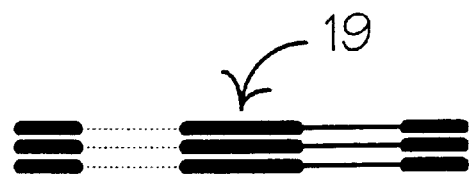
Figure 1B:
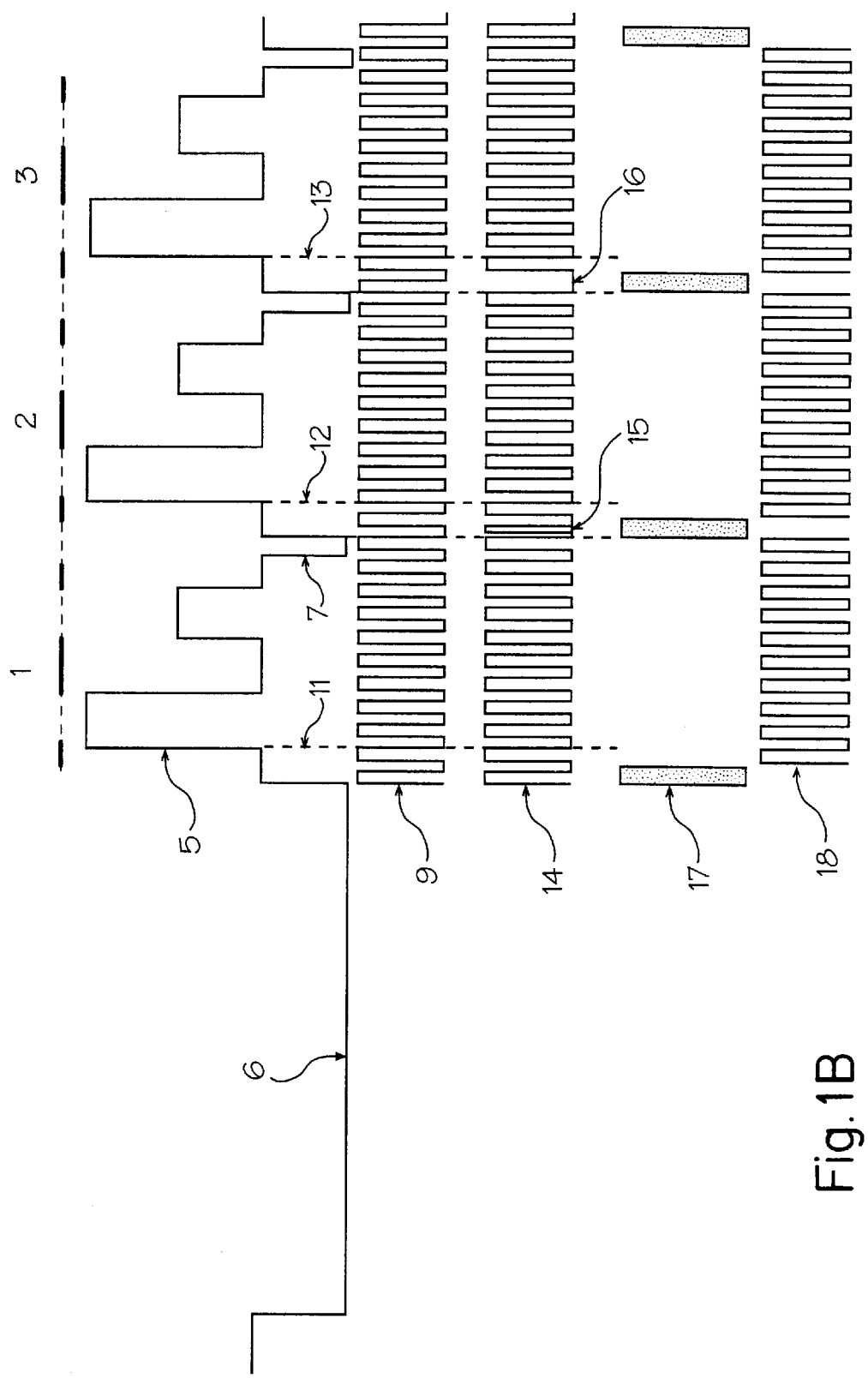

The principle of the synchronous phase-corrected sampling clock 14 of this invention is shown in FIG. 1B, where the frequency of the sampling clock 14 has been briefly raised at 15 and briefly lowered again at 16 with the result that the frequency and the phase of the sampling clock 14 always remains constant relative to the start of each video line 1, 2, 3 (FIG. 1A) during the sampling period of each video line. The brief changes in frequency 15, 16 are necessary to correct the phase of the sampling clock 14; of course, the phase can be shifted directly, but it will be recognized that this will still result in a momentary change in frequency during the time that the phase is changing. Such a phase locked loop (PLL) arrangement where the phase of a fixed-frequency oscillator is shifted directly is sometimes referred to as a delay locked loop (DLL), since the phase is advanced or retarded as necessary—the phase is variably "delayed" in this type of phase locked loop without directly changing the frequency of the oscillator (although, of course, the frequency of the sampling clock is still transiently changed during the time the phase is shifted). In either case equivalent results will be obtained, because the object is to correct the phase of the sampling clock 14. This is achieved by insertion of delays 17, shown schematically in FIG. 1B. The delay is generally of no consequence to video reproduction inasmuch as the video signal typically includes some "dead space" (known as a "porch") after each synchronizing signal. Furthermore, it is certainly possible to define the beginning of the image wherever the user chooses, and it is desirable in some applications to intrude into the image (thereby digitizing only the important part of the image, for example). The cycles of clock 18 consistently begin on a rising edge of clock 18 and the composite waveform 5 is converted into a digital image 19 in which the image lines are in identical phase with each other. It is understood, however, that either the rising edge or the falling edge can be used. It is preferable to trigger the delay generators from an edge of the synchronization signals (or some portion of the signals associated with synchronization periodicity) because, unlike "level" triggering, the edge of a signal occurs at a precise time which is not dependent upon signal strength or "level."

Figure 2:
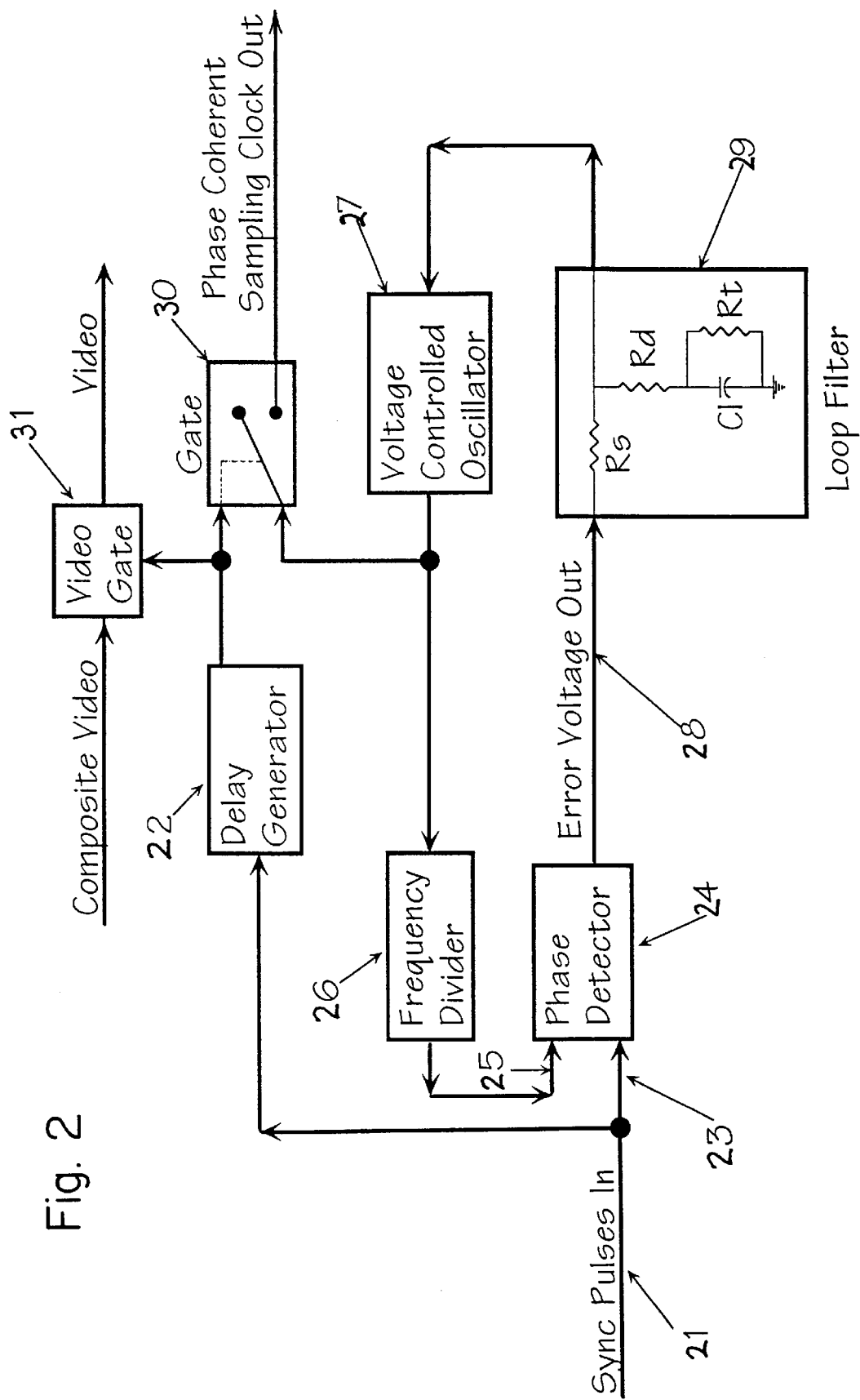
FIGS. 2, 2A and 3 are schematic views of an apparatus of the invention.

An apparatus for practicing the invention is shown schematically in FIG. 2. The video synchronizing pulses 21 are simultaneously delivered to a delay generator 22 and to one input 23 of a phase detector 24. The other input 25 to the phase detector 24 is the output of a frequency divider 26, which divides the frequency of a voltage controlled oscillator (VCO) 27 to equal the synchronizing pulse frequency 21. The error voltage output 28 of the phase detector 24 controls the frequency of the VCO 27 after passing through a loop filter 29. The output of the VCO 27 is delivered to the frequency divider 26 and to the gating device 30. Gate operation is controlled by the output of the delay generator 22. The output of one gating device 30 is the phase-corrected sampling clock used to sample the video image. Another gating device 31, also controlled by the delay generator 22, is used to suspend video processing during the delay, thus converting composite video into wide-dynamic-range video.

Many types of phase detectors are suitable for use with this invention, including both digital and analog detectors or a combination thereof. In any case, it is desirable that the phase detector exhibit a fast response. The phase detector 24 must provide an output suitable for controlling the VCO 27.

Similarly, many frequency sources are suitable for this invention, including crystal controlled or free-running oscillators, such as a VCO, where the frequency is controlled by applied voltage. Likewise, the phase or frequency of crystal oscillators may be suitably adjusted by voltage-controlled phase-shift. In a preferred embodiment, the frequency output of the oscillator may be suitably divided to equal the video synchronizing frequency before application to the phase detector; in this configuration, one frequency derivative is used for phase comparison, while the higher oscillator frequency or some other derivative (or multiple) from a frequency divider, for example, may be used for the sampling frequency. The frequency divider may be a programmable frequency divider.

Figure 2A:
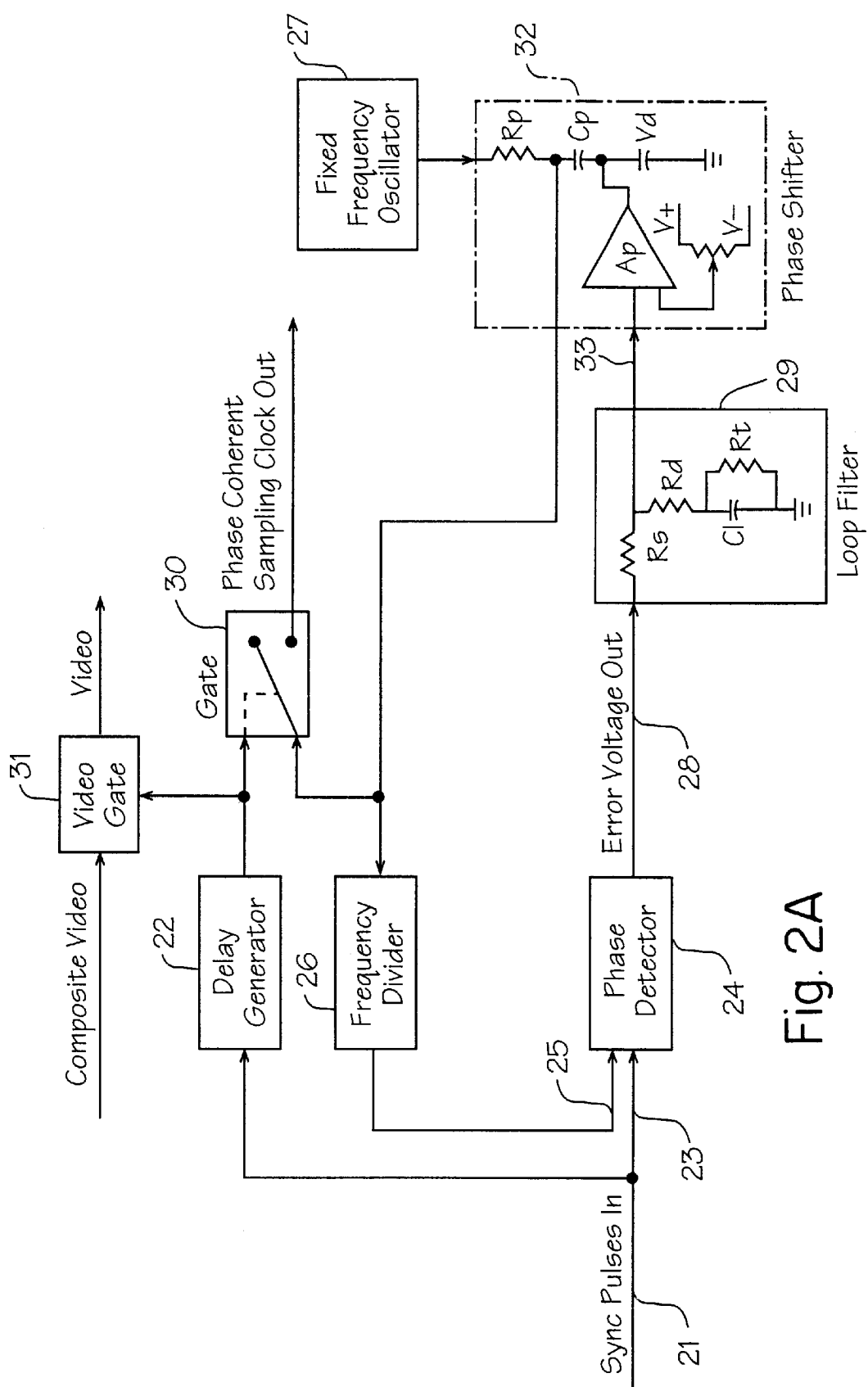

FIG. 2A illustrates, as an alternative to the apparatus of FIG. 2, use of the invention with a fixed-frequency oscillator 27 instead of the voltage-controlled variable-frequency oscillator of FIG. 2. The output of the fixed-frequency oscillator 27 is fed to an R/C phase shifter 32, which shifts the phase of the oscillator-generated sampling clock signal by applying the filtered error voltage 33 to a varactor diode Vd (a varactor diode is a reverse biased semiconductor diode which varies capacitance by applied voltage). The filtered error voltage 33 is isolated through high-impedance differential amplifier Ap to prevent loading of the loop filter 29. The other input to the amplifier sets the operating point of the varactor. Capacitor Cp decouples and isolates the DC control voltage.

FIG. 2A is exactly similar to FIG. 2 except for the phase-shift network 32. There are many circuits suitable for shifting phase in response to applied voltage. This circuit varies capacitance, for example, but other equally suitable circuits can alter the phase by varying the functional equivalent of resistance Rp, while the capacitor value remains constant. The circuit illustrated offers the virtue of extremely high-speed response for higher clock speeds.

A wide variety of circuits for phase-detectors and oscillators have been known for many years and their details are known to one skilled in the art. Indeed, phase-detectors and oscillators for use in phase-locked loop combination are now widely available as single monolithic integrated circuits and their use is highly desirable in a preferred embodiment since discrete high-frequency circuits are sensitive to layout and thermal variation; monolithic integrated circuits largely overcome these variations because the circuits share a close proximal substrate. Those skilled in the art will recognize that this invention is suitable for translation into large scale integrated circuit format (LSI), minimizing or eliminating discrete components.

Figure 3:
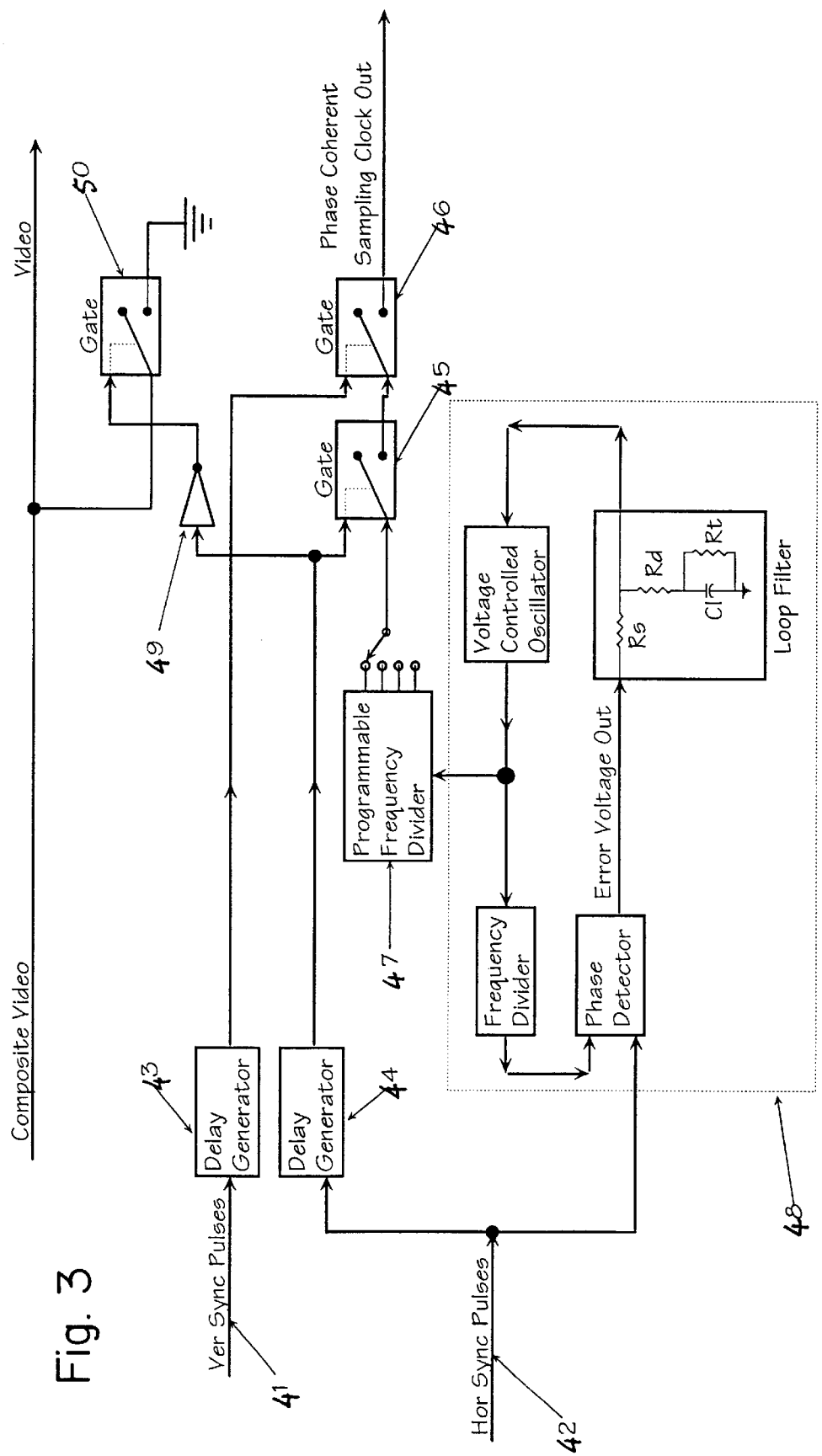

It will be apparent to those skilled in the art that this invention lends itself to many variations which may be profitably applied while remaining within the scope of the inventive concept. For example, a preferred embodiment is shown in FIG. 3, where the vertical synchronizing pulse 41 and the horizontal synchronizing pulse 42 have been separately applied to separate delay generators 43 and 44 respectively, which control separate gates 45 and 46 respectively. The advantage of this arrangement is that the PLL (inside the dashed line at 48) can be provided with a train of horizontal sync pulses 42 with minimal vertical interference, while the vertical sync pulses 41 trigger a separate delay generator 43 which further delays any image sampling until the start of the active, desired image area, thereby preventing the acquisition of useless samples which will never be visible. This arrangement greatly conserves computer resources. A still further refinement is shown where another frequency divider 47 separately divides the VCO output which allows variable sampling rate (and variable true resolution) without changing the VCO base frequency or any loop filter components.

Preferably, the vertical synchronizing pulse 41 and horizontal synchronizing pulse 42 are extracted from the composite video signal using, for example, isolation buffers and/or amplifiers, before being applied to the delay generators 43,44. It is understood, however, that the operation of the delay generators permits use of the pulses 41,42 directly from the composite video signal. In some systems the video and synchronization signals may be isolated or on separate lines, in which case it is not necessary to separate the synchronization signals from the video.

The delay before sampling can be independently generated by any of a variety of suitable circuits, with the main objective being that the delay time be stable and reproducible. The delay must have a time base independent of the sample clock because the sample clock frequency varies until phase lock is achieved. It will be seen in FIG. 1B that, using a phase corrected clock 14, both the number of sample clock pulses and the time between them varies until phase lock. If sampling begins before phase lock, the image will be corrupted because the number of samples will vary line to line, but if sampling begins after phase resolution in the manner of this invention, then the images will enjoy an accuracy heretofore unachieved.

Figure 4A:
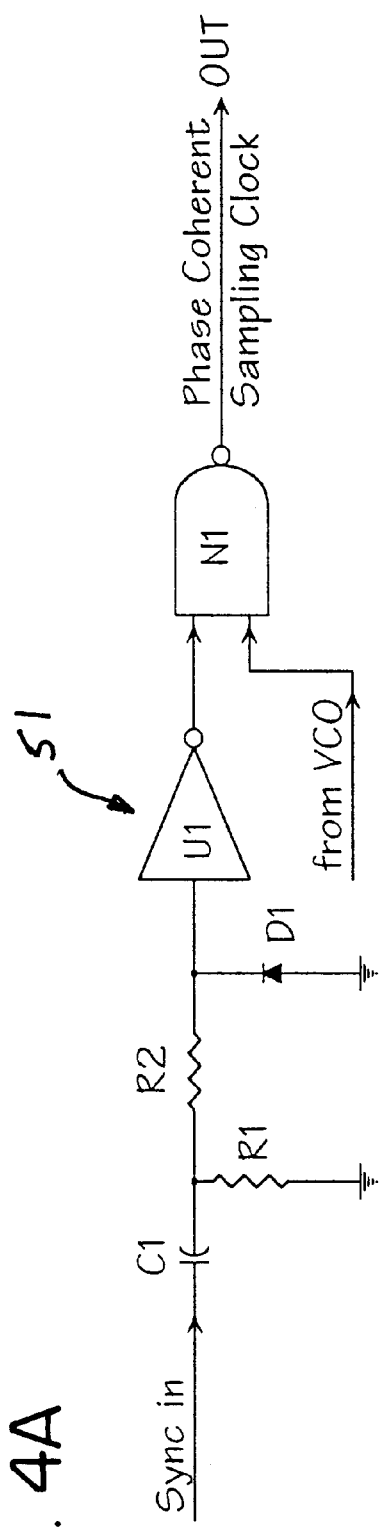
Figure 4B:
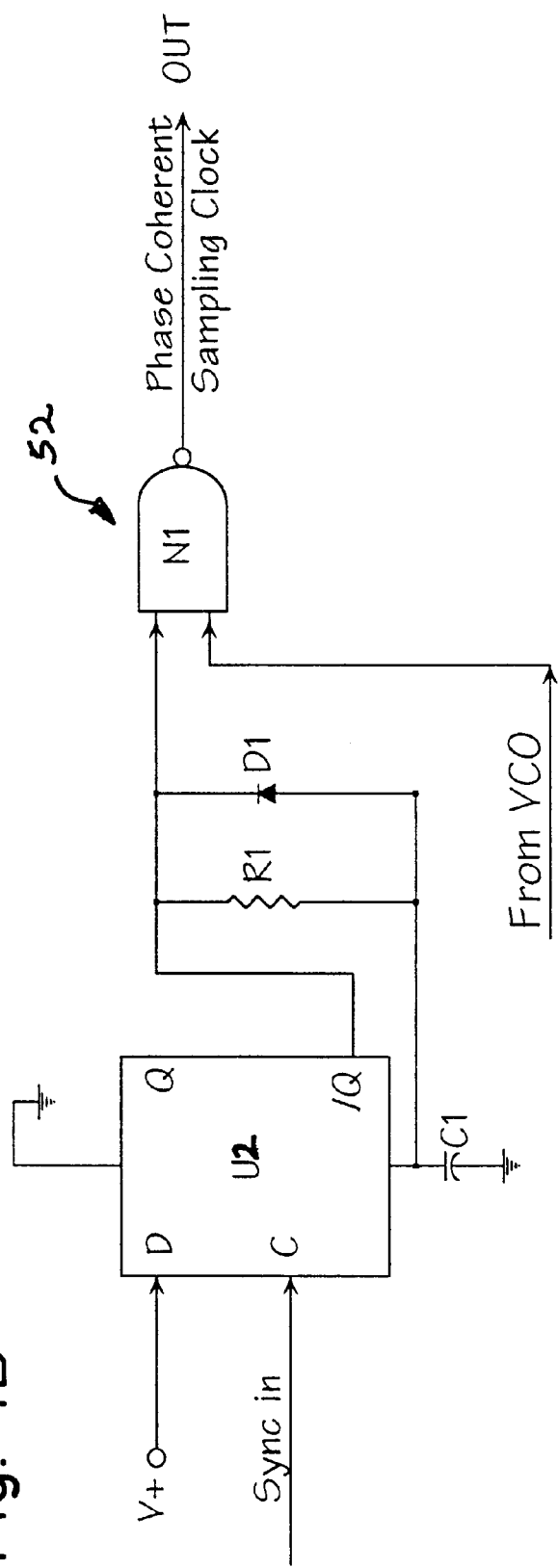

The delay generator may be digital or analog or a combination. Some typical circuits suitable for use with this invention are shown in FIGS. 4A–4C. A typical suitable delay generator circuit 51 includes a monostable differentiator. The R/C combination (R1/C1) provides the time base and determines the length of the delay. The circuit 51 is triggered by the positive (rising) edge of the sync pulse. R2 sharpens the waveshape and Di provides rapid recovery. U1 is typically a Schmitt (snap-action) trigger. The delay output of U1 becomes one input to a generic NAND logic gating device N1 which gates the sampling clock from the VCO (or a generic CMOS analog switch or switching transistor can be used for the gating device, as can a host of other generic analog and digital gates). Another suitable delay generator circuit 52 (FIG. 4B) having a full monostable multivibrator U2 is shown. The input sync pulse clocks in the positive voltage "V+". The R1/C1 combination determines the length of delay. D1 is a recovery diode which discharges C1 when the circuit changes state. Complementary output "/Q" feeds one input of the gating device N1, while the other input is from the VCO; the output of N1 is the phase coherent sampling clock as in circuit 51. Element U2 is a generic Dual-D multivibrator (flip-flop). Yet another delay circuit is shown as circuit 53 (FIG. 4C), where a generic digital frequency divider CD1 is triggered by the rising edge of the sync pulse through a generic NAND gate N2. The other NAND input is clocked by a frequency source and when the counter CD1 terminal count is reached, the output state initiates sampling through another NAND gate N1. The frequency source may be, for example, a crystal oscillator X1 or even the horizontal sync pulses themselves if a delay is also applied after the vertical synchronizing pulse.

The delay generators illustrated are "active" delay circuits, and some active delay circuits are now available as integrated circuits with the delay responsive to an externally applied voltage; such integrated circuits are perfectly suitable for use with this invention if they offer sufficient precision. Similarly, passive "delay lines" may also be used, but they are difficult to precisely control.

A typical composite video signal 61 is illustrated in FIG. 5A, where the video image information is shown separated by the synchronizing pulses 63. In this invention, video amplification (and therefore digital acquisition) occurs only during the video portion of the composite signal, thereby affording improved frequency response, reduced noise, and much wider useful dynamic range, since any video processing (and therefore the analog-to-digital converter) does not have to uselessly amplify and digitize pulses which are never visible. Furthermore, much conventionally-required distortion-producing complex circuitry is eliminated, since amplifier and video signal characteristics do not have to be constantly modified to contend with the synchronizing pulses. Three lines (A,B,C) of composite video are shown in FIG. 5A. The "visible" or video portion is shown at 62, while the absolute black portion of the image is at the dashed line 64. The sync portion 63 of the composite signal is below the black level, sometimes referred to as "blacker than black" to those skilled in the art. In the interest of clarity, a typical industrial composite video waveform 61 is shown; other systems may include additions to the sync (such as equalizing, burst, and blanking pulses) but all systems must at least include the equivalent of the sync pulses illustrated at 63 in FIG. 5.

All high-quality television systems must somehow suppress the sync signals in order to display the images, or the image brightness level will vary with the average level of the scene content. Many circuits of varying complexity have been devised to "strip" the sync from conventional systems, working from the general scheme that an opposing counter voltage is applied to the composite signal which forces the black level to a preset level, usually near ground potential, thus "clamping" the video (a term of art) All of this works quite nicely for viewing on a television receiver, for example, and it certainly stops constant "twiddling" with the brightness and contrast controls with every scene change. But it is completely inadequate for high-fidelity digital imaging, because even the very best, most advanced conventional prior art methods can only achieve an approximation of the original video signal.

Referring again to FIG. 5A, it will be seen that line (A) contains a full white bar (W) and a gray bar of medium value (Gm); (B) has two medium value gray bars; (C) has two dark gray bars (Gd). When these lines of composite video are "clamped" by prior art conventional methods 65 in FIG. 5B, it will be seen that the opposing voltage has reduced the sync, but that any counter voltage (which may be based upon sync amplitude or bias levels in more advanced systems) cannot be correct for all image values, and that the black level 64 must still change with image content. A non-linear characteristic has also been introduced into the amplifiers by the application of the counter voltage, with the result that all tonal values and spatial frequencies are not amplified equally. A more insidious defect is that the dynamic range, the region from white 67 to black 64, has been reduced with the result that precision image value relationships are lost, and noise and distortion have been introduced. Of course, this is intolerable for tomographic reconstruction and the like because the image values can never be computed properly.

This new invention eliminates these difficulties because the sync pulses are prevented from commingling with the video by switching off video processing during the sync pulses.

With the synchronizing pulses removed by suspending amplification during their interval, the video signal appears as at 66 in FIG. 5C. The video no longer contains sync signals, thus allowing full amplification and digitizing resources to be usefully applied to this video part of the signal, and thereby affording the widest possible dynamic range while conserving computer resources, since samples of non-video signals are never taken because of the gated delay.

As shown in FIG. 3, the delay generator 44 controls a gate 50 which shorts the composite video to ground and thus stops video output while establishing an absolute ground reference for any subsequent amplification and A-to-D conversion. The delay generator 44 drives the gate 50 through an inverter 49, which reverses the sense of the delay, so that the video short is removed when the sampling gate 45 permits passage of the clock; put in switch terminology, when sampling gate 45 is closed, gate 50 is open. Of course, such circuit details vary widely with configuration. Similarly, the phase-locked loop must be properly configured.

Phase-locked loops are a widely-used element of electronic technology, finding application in virtually every form of frequency synthesis. Their use as a precision digital sampling clock has been previously encumbered, however, because they exhibit the peculiar property of "hunting," ever searching for the correct phase; for example, the VCO-controlled PLL detects phase but adjusts frequency by changing the oscillator frequency up or down in response to the error voltage. During the "hunting" (a term of art borrowed from servomechanisms which exhibit similar properties) the PLL frequency is constantly changing, and much effort has been expended in conventional loop filter design to minimize this effect with the unfortunate consequence that such "overdamped" circuits lose precision because the loop cannot respond quickly and accurately, resulting in a sampling clock with drifting frequency which produces image artifacts. As explained above, the delay in this invention prevents sampling until the loop frequency has stabilized. However, the loop must stabilize during the delay period; therefore careful loop design is important.

Perhaps no other element of phase-locked loop design has generated so much controversy and dispute as the design of the loop filter; indeed, the loop filter determines the most important performance characteristics of a phase-locked loop, including response time, accuracy, and jitter. A typical PLL with the loop filter is shown at 29 in FIG. 2. The error output voltage of the phase detector passes through settling (Rs) and damping (Rd) resistors and is accumulated by loop capacitor (C1) which controls the voltage controlled oscillator. The primary purpose of the loop filter is to retain stability by operating as a charge pump reservoir to maintain oscillator frequency phase between each cycle of phase detection. Loop design for high-precision television sampling in a computer environment is especially critical because the horizontal synchronizing frequency is periodically interrupted by the vertical synchronizing frequency, which means that the phase-locked loop must very rapidly and accurately recover from very large changes in frequency in an electrically noisy computer environment. If the loop responds too rapidly, jitter will actually be introduced as the loop overshoots while hunting for the correct phase. If the loop is too slow, phase correction will take too long to stabilize for this invention. Put simply, ordinary PLL design is chiefly concerned with achieving phase lock and not how long it takes to do it.

In order to produce images of higher precision, this new invention introduces a new element in filter design as it may be required: a variably terminated loop filter which uniformly controls the amount of time required for the loop to stabilize. Such a loop filter 29 is illustrated in FIG. 2, where a simple resistor (Rt) is shown corrected in parallel with the loop capacitor (C1). Conventional filter design would have the capacitor unterminated, since conventional design supposes a single design center frequency. However, the phase-locked loop of this invention must contend with periodically changing synchronizing frequencies. The resistance serves to control hysteresis and phase shift, so that error voltage applied to the capacitor results in precise, predictable correction of the oscillator. (Hysteresis refers to the tendency of device characteristics to be altered by recent history. Capacitative hysteresis is a well-documented phenomenon and, in this case, is particularly troublesome if uncontrolled because of the periodic interruption of the higher horizontal frequency by the lower vertical frequency.) For use in the digital sampling of this invention, the charge and decay of the loop capacitor must uniformly respond to any error correction voltage. For some synchronizing frequencies and loop components, this is not possible without some means to control hysteresis. The termination resistance handily provides that control. There are many types of phase locked loop filters and some may include amplification to raise the minute error signals to higher levels or to precisely tailor the frequency characteristics of the loop filter; this is known as an "active filter" loop, but all loop filter designs must include a capacitance.

The resistor may be fixed or variable, but the value is preferably determined dynamically, while the phase-locked loop is operating. The actual resistance value may vary widely, depending upon the oscillator frequency and characteristics of various circuit elements, but, in general, the resistance will fall between 0.5 and 5 megohms for most designs. Of course, the term "resistor" is understood to mean any energy absorbing device when shunting the loop capacitance including, for example, transistors, diodes, photoresistors and inductors. The resistor offers the virtue of simplicity, while many other devices may allow for remotely adjustable precision tuning.

A general process for adjusting circuit element values and the delay time is quite simple: a stable image pattern is clocked into the computer producing a digital image as described in this invention and each next successive digital image of the pattern is subtracted from its predecessor, thus producing a series of differential images which are displayed for viewing. Since the pattern is stable and unchanging, any spatial differences which appear on the screen will be the result of undesirable phase or frequency changes in the sampling clock. Circuit elements (which may include the shunt termination resistor) and the time delay are then simply adjusted until the differential images no longer display spatial variations resulting from phase jitter. Ideally, the resultant image will be a virtually blank screen. Of course, the resultant image easily lends itself to many types of statistical analysis, such as a histogram of displaced pixels, and this numerical output can be additionally employed as a quality-control tool not only for manufacturing the invention, but also for monitoring the quality of the television system, because phase jitter creeping into the synchronizing signals and other noise will also produce a corrupted image.

The need for such pristine imaging and such careful monitoring afforded by this invention is clearly illustrated in FIG. 6A where a video image from a medical video fluoroscope 71 is shown, typically of internal tissues 74. A radiopaque angiographic dye is introduced to indicate where the blood may perfuse the vessels 75. A single line of video 76 is graphed 77 below all images. Because the density of the surrounding tissues makes visual clutter, it is desirable to subtract an image without the dye 72 from an image with the dye 71, thereby showing only the path of the dye 73, since the dye path is the only thing which should change between images (a technique known as "digital subtraction angiography"). Dye path 78 represents the dye path result of images acquired with this new invention.

In contrast, conventional digital imaging processes, shown in FIG. 6B using the same video image 71, typically produce images with errors 81 where the phase jitter has produced an image error artifact 83 which competes with the correct visual interpretation of the dye. This error has resulted from the slight shift 82 of a portion of the image 80. This deleterious phenomenon is universally recognized and widely known as "pixel displacement error," and it greatly inhibits full use of the technique. Of course, the illustration has been simplified for clarity; in actual practice, there are copious error artifacts scattered throughout the image, making the images from conventional prior-art processes very difficult to reliably interpret because the image artifacts are a dangerous nuisance. For the reasons described, this new invention entirely eliminates pixel displacement error and the images enjoy both spatial fidelity and correct extended dynamic range, allowing unambiguous interpretation of the improved contrast ratio.

Of course, the term "computer" as used in the context of this invention will be understood by those skilled in the art to mean any device which controls the digital imaging process, such as the common microprocessor. Similar digital processors are often incorporated directly into the video camera for direct digital output; such an arrangement is often called a "digital" camera, although the actual imaging process always begins as an analog event which is desirably quantized with this new synchronized phase-coherent digital sampling system, exactly as described earlier. Certainly this invention is applicable to such digital cameras and any other system benefiting from a phase-coherent synchronized sampling clock, especially when it is considered that the camera is the source of the video image, and any image defects introduced there, such as improper black level and sampling phase errors, become progressively more difficult to correct. The phase coherent sampling clock of this invention may certainly be used to sample so-called "component" color video, where RGB or YUV (YIQ) signals must be simultaneously applied.

The phase coherent images produced by this invention are also particularly useful for digital stereo radiography, where conventional images with pixel displacement error render the images unusable because the right-eye and left-eye images become confused. Similarly, the precise, unambiguous pixel locates produced by this invention are important in machine-vision applications where a stored image is compared to a current image for purposes of precise object location, as in radiation therapy, for example, where the patient must be precisely repositioned for subsequent treatments. In this application of the invention, a digital image of the patient in the correct treatment position is stored. When the patient returns for subsequent treatments, the treatment position can be perfectly duplicated by comparing the current patient position to (or subtracting it from) the stored image. When there is no pertinent difference between the current image of patient position and the stored image of patient position, then it will be apparent that the patient is in an identical treatment position, which is essential for accurate radiation therapy where the radiation treatments may be divided over many days or weeks. Conventional technology for producing digital images produces so many pixel displacement artifacts, as described earlier, that patient relocation by stored image has been overly time-consuming, impractical, and inaccurate. This invention greatly facilitates the procedure.

FIG. 7 illustrates typical use of the invention together with a modern digital computer.

Shown at the dashed line A is the Synchronous Phase Coherent Image Acquisition module where the analog video is input at 84 and the video synchronizing information is separated therefrom by synchronization separator 85 into the vertical and horizontal pulses. The horizontal synchronizing pulse initiates the horizontal delay produced by horizontal delay generator 86. During the horizontal delay, the PLL clock 87 synchronizes and corrects the phase of the PLL sampling clock 87; the horizontal delay generator 86 also inhibits further video processing until the delay times out. Similarly, the vertical delay generator 88 inhibits passage of the PLL sampling clock signal to the A/D converter 89. At the end of the delays, the PLL clock 87 begins A/D conversion. Digital video 90 is then available at the output of the A/D converter 89, which may be used for transmission to a display unit (not shown) or for broadcast, for example.

If it is desired to input the digital video to a modern, general purpose digital computer, then an interface module I is generally necessary to input the data to the computer. The interface module I is shown under the control of a state machine 93. A state machine is a computer term of art for devices which indicate and control various states of operation; in this case, for example, the state machine indicates and controls whether the device is finished transferring an image to interface memory 94 as the memory counters 95 transfer the digital conversions. Similarly, the state machine receives instructions from the computer C about which state is desired, such as taking an image after the operator has pressed a pushbutton external trigger 96, for example.

The images are transferred into the computer C via isolation buffers 97 to the data bus 98 of the computer C, which receives the images at the decoded address of the interface. Whether the computer is sending control instructions to the interface I, or receiving images, or awaiting change of state is under I/O (in-out) control 100 of the computer, all of which is under control of the computer program 101, which further determines whether the digital video data is sent via computer memory 102 to storage 103 (such as disc media, for example) or whether the images are immediately output to display 104, or otherwise processed.

In typical operation, video gate 91 which is responsive to the horizontal delay generator 86 allows passage of the video signal after the delay. The video signal is amplified and conditioned at 92 before application to the A/D converter 89, which, after each delay for phase correction, is clocked in phase synchronism with the incoming video synchronizing signals which have been separated from the composite video signal. The memory counters 95 are advanced with such conversion, and the video data is written to on-board memory. When the video capture is complete, the state machine 93 signals a capture and the command latch changes the state machine to a read cycle. The counters are reset and advanced with each read until the field is read into computer memory and displayed on the monitor. The state machine is then reconverted to a capture mode and a capture cycle begins anew. Images are sent to memory or saved to disk by signal to the computer from an external trigger buffered onto the data bus.

Of course, some kinds of "embedded" (dedicated) computers do not require an elaborate interface, because they are dedicated to a single task—such as imaging. In this case, the interface I would likely be unnecessary and the A/D conversions can be processed with very simple (often hard-wired) instructions to go directly to memory, storage or display.

Figure 8:
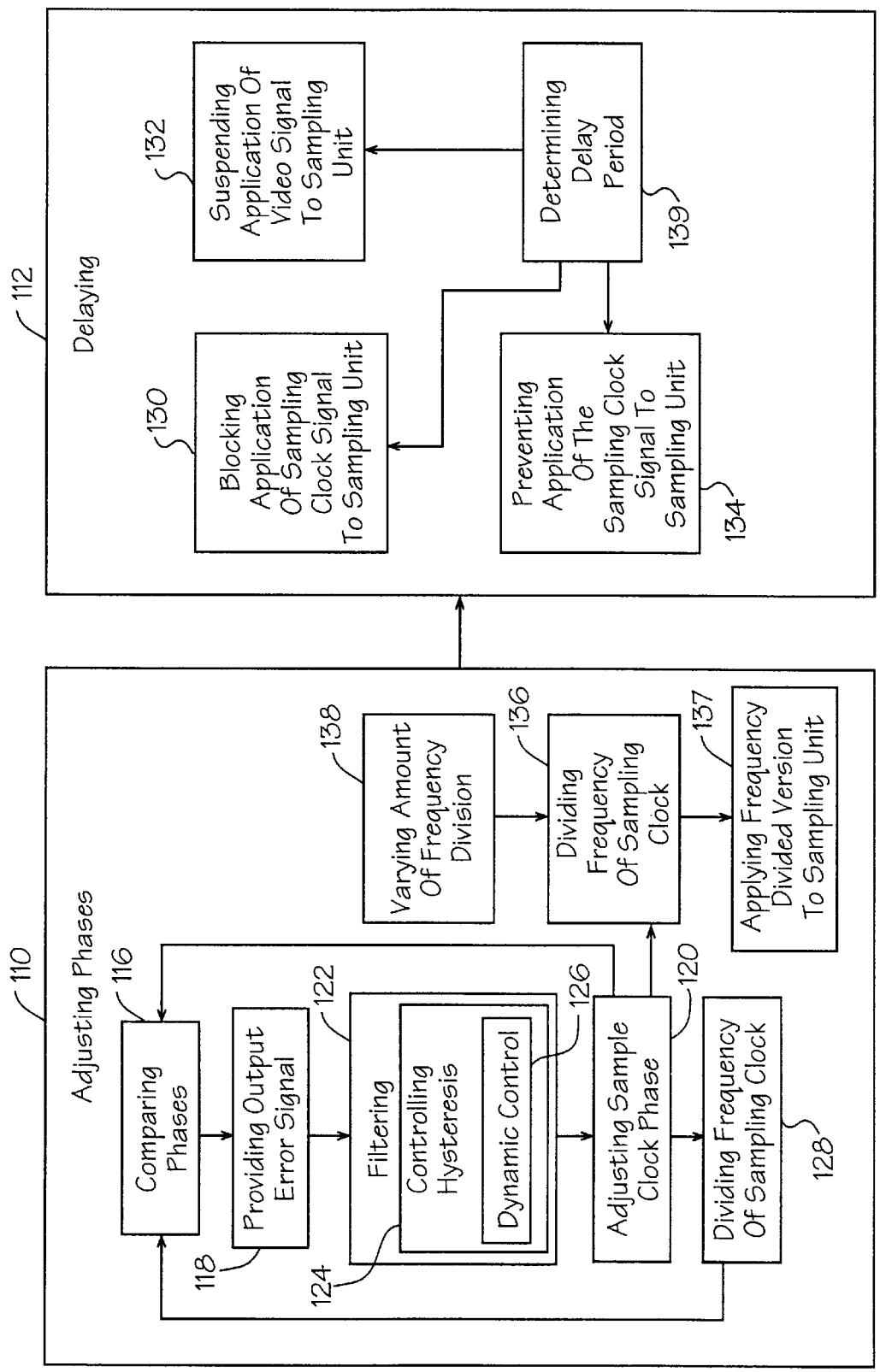
FIGS. 8 and 9 are flow charts illustrating a preferred method according to the present invention.

As illustrated in FIG. 8, the present invention provides a method for synchronizing sampling of a video signal to a video synchronization signal of the video signal. According to a preferred implementation, the method includes the step 110 of adjusting a phase of a sampling clock signal to coincide with a phase of a video synchronization signal, and the step 112 of delaying sampling of the video signal at least until the phase of the sampling clock signal has been adjusted to coincide with the phase of a video synchronization signal.

Preferably, the step 110 of adjusting includes applying the sampling clock signal and a video synchronization signal into a phase-locked loop arrangement. Phases of the sampling clock signal and a video synchronization signal are compared, in step 116. An output error signal is provided in step 118. The output error signal represents the extent of phase difference between sampling clock and video synchronization signals. The output error signal communicates with the sampling clock signal, and the sampling clock signal is adjusted in step 120 in accordance with the output error signal. The output error signal represents the extent of phase different between sampling clock and video synchronization signals. The sampling clock signal then is generated, in step 120, in a manner dependent upon the output error signal.

Preferably, generation of the sampling clock signal is generated by a voltage-controlled oscillator and the output error signal is a voltage representing the extent of phase difference between sampling clock and video synchronization signals.

The method of the present invention further may comprise the step 122 of filtering the output error signal using a loop filter.

The step 122 of filtering preferably includes a step 124 of controlling hysteresis by connecting a hysteresis controlling resistance in parallel to a capacitive element of the loop filter. The step 124 of controlling hysteresis also may include the step 126 of dynamically controlling hysteresis by varying the hysteresis controlling resistance.

The step 110 of adjusting may also comprise a step 128 of dividing the frequency of the sampling clock signal to a frequency associated with the video synchronization signal. A frequency divided version of the sampling clock signal thereby is provided. The phase of this frequency divided version is compared to the phase of the video synchronization signal in step 116, rather than performing the comparison using the sampling clock signal itself.

The step 112 of delaying comprises a step 130 of blocking application of the sampling clock signal to a sampling unit which samples the video signal. Such blocking is maintained at least until the phase of the sampling clock signal coincides with a phase of the video synchronization signal.

The step 112 of delaying may include a step 132 of suspending application of the video signal to the sampling unit at least until the phase of the sampling clock signal coincides with a phase of the video synchronization signal. Preferably, step 132 is performed by grounding a video signal line which carries the video signal to the sampling unit, at least until the phase of the sampling clock signal coincides with a phase of the video synchronization signal.

The video synchronization signal referred to above with respect to FIG. 8 constitutes a horizontal synchronization signal and the step 112 of delaying further includes a step 134 of preventing, in response to a vertical synchronization signal in the video signal, application of the sampling clock signal to the sampling unit. Application of the sampling clock signal is prevented in step 134 at least until the phase of the sampling clock signal coincides with a phase of the horizontal synchronization signal.

When step 134 is performed, application of the video signal preferably is suspended at least until the phase of the sampling clock signal coincides with a phase of the horizontal synchronization signal.

Preferably, the method also includes the step 136 of frequency dividing the sampling clock signal to provide a frequency divided version of the sampling clock signal, and the step 137 of applying the frequency divided version of the sampling clock signal to the sampling unit. By providing the frequency divided version to the sampling unit, the sampling unit is caused to perform sampling of the video signal at a sampling rate determined by the frequency divided version.

The value by which the sampling clock signal is frequency divided preferably is selectively varied in step 138 to provide different sampling resolutions.

Figure 9:
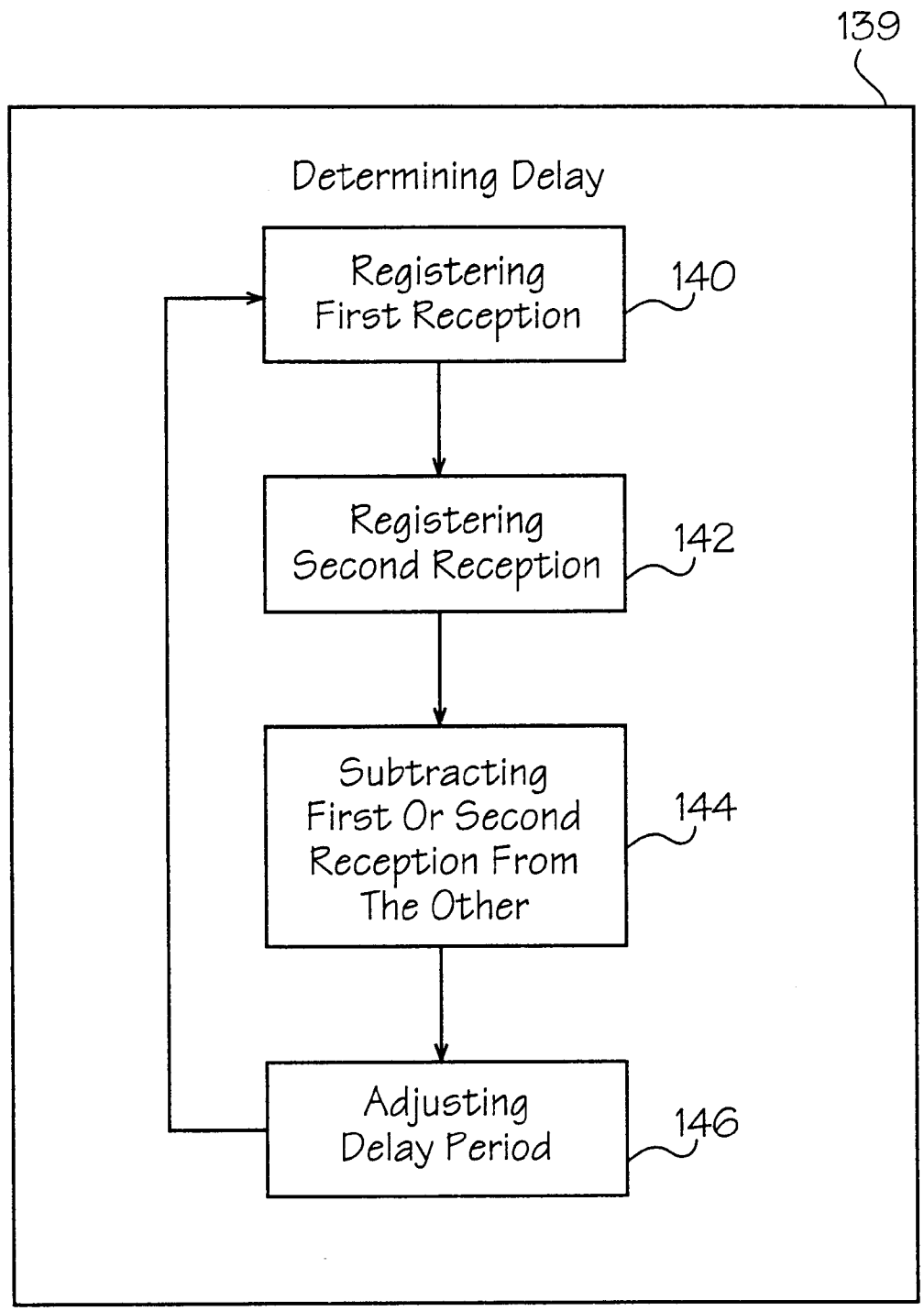

Preferably, the method of the present invention includes a step 139 of establishing a delay period for the step 112 of delaying. As illustrated in FIG. 9, the step 139 of establishing a delay period preferably includes the step 140 of registering a first reception of a stable image pattern using the steps 110,112 of adjusting and delaying; the step 142 of registering a second reception of the stable image pattern using the steps 110,112 of adjusting and delaying; the step 144 of subtracting one of the first and second receptions from the other of the first and second receptions to generate a differential image representing differences, if any, between the first and second receptions; and the step 146 of adjusting the delay period and repeating the steps 140,142,144 of registering and subtracting until the differential image indicates absence of the differences between the first and second receptions.

While the flow charts of FIGS. 8 and 9 show arrows between the various steps, it is understood that the various steps can be performed in any desired order and that most can be carried out in parallel. In this regard, the present invention is not limited to the order of steps shown in FIGS. 8 and 9.

It is understood that the foregoing method can be carried out by a computer using known programming techniques, or by a hardwired circuit, or a combination of a computer and hardwired circuitry.

While the invention has been described with respect to certain embodiments thereof, variations and modifications will be apparent to one skilled in the art, without departing from the spirit and scope of the invention.

I claim:

1. An apparatus for synchronizing sampling of a video signal to a video synchronization signal of said video signal, said apparatus comprising:
    a phase corrector, responsive to said video synchronization signal and capable of adjusting a phase of a sampling clock signal in order to coincide with a phase of said video synchronization signal; and
    a first delay element to delay said sampling of said video signal at least until said phase corrector has adjusted the phase of said sampling clock signal to coincide with a phase of said video synchronization signal.

2. The apparatus of claim 1, wherein said phase corrector comprises a phase-locked loop arrangement.

3. The apparatus of claim 2, wherein said phase-locked loop arrangement comprises a phase detector capable of detecting the extent of phase difference between the phase of said sampling clock signal and the phase of said video synchronization signal and capable of providing an output error signal, said output error signal communicating the extent of said phase difference between said sampling clock signal and said video synchronization signal and communicating adjustment to be applied to the phase of said sampling clock signal.

4. The apparatus of claim 2, wherein said phase-locked loop arrangement comprises,
    a phase detector configured to compare the phase of said sampling clock signal to the phase of said video synchronization signal and to provide an output error signal representing the extent of a phase difference between said sampling clock signal and said video synchronization signal, and
    an oscillator communicating with said output error signal in such a manner that said sampling clock signal generated by said oscillator is adjusted according to said output error signal.

5. The apparatus of claim 4, wherein said oscillator is a voltage-controlled oscillator and wherein said output error signal is a voltage communicating the extent of said phase difference between said sampling clock signal and said video synchronization signal.

6. The apparatus of claim 4, wherein said oscillator is a fixed-frequency oscillator which generates said sampling clock signal, and wherein said sampling clock signal communicates with a phase shifter, and said phase shifter communicates with said output error signal in such manner that said phase shifter adjusts the phase of said sampling clock signal in accordance with said output error signal.

7. The apparatus of claim 4, wherein said phase-locked loop arrangement further comprises a loop filter connected between said oscillator and said phase detector.

8. The apparatus of claim 7, wherein said loop filter comprises:
    a capacitive element; and
    an hysteresis controlling resistance connected in parallel to said capacitive element.

9. The apparatus of claim 8, wherein said hysteresis controlling resistance is variable.

10. The apparatus of claim 7, wherein said loop filter comprises:
    a settling resistance communicating with said output error signal between said phase detector and said oscillator;
    a damping resistance communicating with said output error signal between said phase detector, said oscillator and ground;
    a capacitance communicating with said output error signal between said phase detector and said oscillator; and
    an hysteresis controlling resistance connected in parallel with said capacitance.

11. The apparatus of claim 10, wherein said hysteresis controlling resistance is variable.

12. The apparatus of claim 4, wherein said phase-locked loop arrangement further comprises a frequency divider communicating between said sampling clock signal and said phase detector, said frequency divider being arranged so as to divide a frequency of said sampling clock signal to produce a frequency associated with said video synchronization signal, thereby providing a frequency divided version of said sampling clock signal, said frequency divided version of said sampling clock signal being applied to said phase detector so that said phase detector detects the extent of phase difference between said frequency divided version of the sampling clock signal and the phase of said video synchronization signal.

13. The apparatus of claim 1, further comprising a gate communicating with said first delay element and capable of communicating said sampling clock signal to said video signal, said gate being responsive to said first delay element and being arranged so as to prevent application of said sampling clock signal to said video signal at least until said phase corrector has adjusted a phase of said sampling clock signal to coincide with a phase of said video synchronization signal.

14. The apparatus of claim 13 further comprising a video gate communicating with said first delay element and connectable to a video output line which carries said video signal to a sampling unit which samples said video signal according to said sampling clock signal, said video gate being responsive to said first delay element and arranged so as to suspend said video signal from said video output line at least until said phase corrector has adjusted the phase of said sampling clock signal to coincide with a phase of said video synchronization signal.

15. The apparatus of claim 14, wherein said video gate is responsive to said first delay element and is capable of grounding the video output line at least until the phase of said sampling clock signal has been adjusted to coincide with a phase of said video synchronization signal.

16. The apparatus of claim 1, wherein said first delay element comprises a monostable differentiator triggered by an edge of said video synchronization signal.

17. The apparatus of claim 1, wherein said first delay element comprises a monostable multivibrator triggered by an edge of said video synchronization signal.

18. The apparatus of claim 1, wherein said first delay element comprises a digital frequency divider triggered by an edge of said video synchronization signal.

19. The apparatus of claim 1, wherein said video synchronization signal is a horizontal synchronization signal, and said apparatus further comprises:
    a second delay element responsive to a vertical synchronization signal, said second delay element being arranged so as to prevent sampling of said video signal at least until said phase corrector has adjusted a phase of said sampling clock signal to coincide with the phase of said horizontal synchronization signal.

20. The apparatus of claim 19, further comprising a video gate communicating with said first delay element and connectable to a video output line which carries said video signal to a sampling unit which samples said video signal in accordance with said sampling clock signal, said video gate being responsive to said first delay element and arranged so as to suspend said video signal from said video output line at least until the phase of said sampling clock signal coincides with the phase of said horizontal synchronization signal.

21. The apparatus of claim 19, further comprising a first gate communicating with said first delay element and connectable to a sampling unit which samples said video signal in accordance with said sampling clock signal, said first gate being responsive to said first delay element and being arranged so as to delay, in accordance with said horizontal synchronization signal, application of said sampling clock signal to said sampling unit at least until the phase of said sampling clock signal is adjusted to coincide with the phase of said horizontal synchronization signal.

22. The apparatus of claim 21, further comprising a second gate communicating with said second delay element and connectable to said sampling unit, said second gate being responsive to said second delay element and being arranged so as to delay, in accordance with said vertical synchronization signal, application of said sampling clock signal to said sampling unit at least until the phase of said sampling clock signal is adjusted to coincide with the phase of said horizontal synchronization signal.

23. The apparatus of claim 20, further comprising a video gate communicating with said first delay element and connectable to a video output line which carries said video signal to said sampling unit, said video gate being responsive to said first delay element and arranged so as to suspend said video signal from said video output line at least until the phase of said sampling clock signal is adjusted to coincide with the phase of said horizontal synchronization signal.

24. The apparatus of claim 23, further comprising an inverter communicating with said first gate and said video gate and arranged so that when said first gate is open said video gate is closed and so that when said first gate is closed said video gate is open.

25. The apparatus of claim 1, wherein said phase corrector comprises,
    (a) a phase-locked loop arrangement comprising,
        (i) a phase detector capable of comparing the phase of said sampling clock signal to the phase of said video synchronization signal and capable of providing an output error signal indicating presence of a phase difference between said sampling clock signal and said video synchronization signal, and
        (ii) an oscillator communicating with said output error signal, said oscillator being arranged so as to generate said sampling clock signal in a manner dependent upon said output error signal, and
    (b) a frequency divider communicating with said sampling clock signal from said oscillator, said frequency divider being arranged so as to divide a frequency of said sampling clock signal by one of a plurality of selectable values to generate a frequency divided version of said sampling clock signal and a respective sampling rate.

26. The apparatus of claim 25, wherein said phase-locked loop arrangement further comprises an additional frequency divider communicating with said sampling clock signal and said phase detector, said additional frequency divider being arranged so as to divide the frequency of said sampling clock signal to a frequency associated with said video synchronization signal, thereby providing an additional frequency divided version of said sampling clock signal, said additional frequency divided version of said sampling clock signal being applied to said phase detector so that said phase detector compares the phase of said additional frequency divided version of the sampling clock signal to the phase of said video synchronization signal.

27. A method for synchronizing sampling of a video signal to a video synchronization signal of said video signal, said method comprising:
    adjusting a phase of a sampling clock signal to coincide with a phase of said video synchronization signal; and
    delaying said sampling of said video signal at least until the phase of said sampling clock signal has coincided with the phase of said video synchronization signal.

28. The method of claim 27, wherein said adjusting comprises applying said sampling clock signal and said video synchronization signal into a phase-locked loop arrangement.

29. The method of claim 28, wherein said adjusting comprises,
    comparing the phase of said sampling clock signal to the phase of said video synchronization signal and
    providing an output error signal representing the extent of phase difference between said sampling clock signal and said video synchronization signal.

30. The method of claim 29, wherein said adjusting comprises modifying said sampling clock signal in a manner dependent upon said output error signal.

31. The method of claim 30, wherein said modifying is carried out by a voltage-controlled oscillator which generates said sampling clock signal in accordance with said output error signal, wherein said output error signal is a voltage representing the extent of said phase difference between said sampling clock signal and said video synchronization signal.

32. The method of claim 30, wherein said modifying is carried out by a phase shifter which, in accordance with said output error signal, shifts the phase of said sampling clock signal, which sampling clock signal is generated by a fixed-frequency oscillator and wherein said output error signal is a voltage representing the extent of said phase difference between said sampling clock signal and said video synchronization signal.

33. The method of claim 31, wherein said modifying further comprises a step of filtering said output error signal using a loop filter.

34. The method of claim 33, wherein said step of filtering comprises a step of controlling hysteresis by connecting a hysteresis controlling resistance in parallel to a capacitive element of the loop filter.

35. The method of claim 34, wherein said controlling hysteresis comprises dynamically establishing a value of said hysteresis controlling resistance.

36. The method of claim 30, wherein,
said adjusting further comprises dividing a frequency of said sampling clock signal to a frequency associated with said video synchronization signal, to thereby provide a frequency divided version of said sampling clock signal, and
said comparing comprises comparing a phase of said frequency divided version of the sampling clock signal to a phase of said video synchronization signal.

37. The method of claim 27, wherein said delaying comprises preventing sampling of said video signal by blocking application of said sampling clock signal to a sampling unit which samples said video signal at least until a phase of said sampling clock signal coincides with a phase of said video synchronization signal.

38. The method of claim 37, further comprising suspending application of said video signal to said sampling unit at least until the phase of said sampling clock signal coincides with a phase of said video synchronization signal.

39. The method of claim 38, wherein said suspending comprises grounding a video output line which carries said video signal to the sampling unit, at least until the phase of said sampling clock signal coincides with a phase of said video synchronization signal.

40. The method of claim 27, wherein said video synchronization signal is a horizontal synchronization signal, said method further comprising delaying application of said sampling clock signal to said video signal in response to a vertical synchronization signal at least until a phase of said sampling clock signal coincides with a phase of said horizontal synchronization signal.

41. The method of claim 39, further comprising suspending application of said video signal to said sampling unit at least until the phase of said sampling clock signal coincides with a phase of said horizontal synchronization signal.

42. The method of claim 41, wherein said suspending comprises grounding a video output line which carries said video signal to the sampling unit at least until the phase of said sampling clock signal coincides with a phase of said horizontal synchronization signal.

43. The method of claim 27, further comprising,
frequency dividing said sampling clock signal to provide a frequency divided version of said sampling clock signals, and
applying said frequency divided version of said sampling clock signal to a sampling unit that samples said video signal at a sampling rate determined by said frequency divided version.

44. The method of claim 43, further comprising selectively varying a value by which said sampling clock signal is frequency divided to thereby provide different sampling resolutions.

45. The method of claim 43, wherein said adjusting further comprises dividing a frequency of said sampling clock signal to a frequency associated with said video synchronization signal, to thereby provide an additional frequency divided version of said sampling clock signals, and
said comparing comprises comparing a phase of said additional frequency divided version of the sampling clock signal to the phase of said video synchronization signal.

46. The method of claim 27, further comprising establishing a delay period for said delaying, said establishing comprising,
registering a first reception of a stable image pattern using said adjusting and delaying,
registering a second reception of said stable image pattern using said adjusting and delaying,
subtracting one of said first and second receptions from the other of said first and second receptions to generate a differential image representing differences between said first and second receptions, and
adjusting said delay period and repeating said registering and subtracting until said differential image indicates absence of said differences between said first and second receptions.

47. The method of claim 46, wherein said adjusting of said delay period comprises,
applying said sampling clock signal and said video synchronization signal into a phase-locked loop arrangement,
comparing the phase of said sampling clock signal to a phase of said video synchronization signal,
providing an output error signal representing the extent of phase difference between said sampling clock signal and said video synchronization signals,
filtering said output error signal using a loop filter, wherein said filtering includes controlling hysteresis by connecting a hysteresis controlling resistance in parallel to a capacitive element of the loop filter, and
varying the resistance of the hysteresis controlling resistance.

48. An apparatus for synchronizing sampling of a video signal to a video synchronization signal of said video signal, said apparatus comprising:
a phase corrector, responsive to said video synchronization signal and capable of adjusting a phase of a sampling clock signal in order to coincide with a phase of said video synchronization signal; and
a first delay element to delay said sampling of said video signal at least until said phase corrector has adjusted the phase of said sampling clock signal to coincide with a phase of said video synchronization signal,
wherein said phase corrector is configured as a phase-locked loop containing a loop filter, said loop filter including a capacitive element and a hysteresis controlling resistance connected in parallel to said capacitive element.

49. The apparatus of claim 48, wherein said phased-locked loop further includes a phase detector coupled to said loop filter, said phase detector being capable of comparing the phase of said sampling clock signal to the phase of said video synchronization signal and generating an output error signal representing the extent of a phase difference between said sampling clock signal and said video synchronization signal.

50. The apparatus of claim 49, wherein said phased-locked loop further includes an oscillator coupled to said loop filter, said oscillator configured to communicate with said output error signal to adjust the phase of said sampling clock signal generated by said oscillator.

51. The apparatus of claim 50, wherein said loop filter further includes, a settling resistance communicating with said output error signal between said phase detector and said oscillator, and a damping resistance communicating with said output error signal between said phase detector, said oscillator, and ground.

52. The apparatus of claim 51, wherein said hysteresis controlling resistance is variable.

* * * * *